(12) United States Patent
Mazumder et al.

(10) Patent No.: US 11,574,661 B1
(45) Date of Patent: Feb. 7, 2023

(54) SHARED COMMAND SHIFTER SYSTEMS AND METHODS

(71) Applicant: Micron Technology, inc., Boise, ID (US)

(72) Inventors: Kallol Mazumder, Dallas, TX (US); Navya Sri Sreeram, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/501,812

(22) Filed: Oct. 14, 2021

(51) Int. Cl.
*G11C 7/10* (2006.01)

(52) U.S. Cl.
CPC ............ *G11C 7/1012* (2013.01); *G11C 7/106* (2013.01); *G11C 7/1039* (2013.01); *G11C 7/1063* (2013.01); *G11C 7/1066* (2013.01); *G11C 7/1093* (2013.01); *G11C 7/1096* (2013.01)

(58) Field of Classification Search
CPC ..... G11C 7/1012; G11C 7/1039; G11C 7/106; G11C 7/1063; G11C 7/1066; G11C 7/1093; G11C 7/1096
See application file for complete search history.

(56) References Cited

U.S. PATENT DOCUMENTS

| | | | | |
|---|---|---|---|---|
| 7,936,636 | B2* | 5/2011 | Jeong | G11C 7/1066 327/158 |
| 9,123,398 | B2* | 9/2015 | Lee | G11C 7/1093 |
| 9,123,403 | B2* | 9/2015 | Byun | G11C 7/109 |
| 10,254,782 | B2* | 4/2019 | He | G11C 7/222 |
| 10,891,995 | B2* | 1/2021 | Choi | G11C 11/1675 |
| 11,056,171 | B1* | 7/2021 | Mazumder | G11C 11/4093 |
| 11,062,750 | B2* | 7/2021 | Lee | G11C 7/22 |
| 11,322,193 | B2* | 5/2022 | Kim | G11C 11/4076 |
| 11,348,633 | B2* | 5/2022 | Miyano | G11C 11/4076 |

* cited by examiner

*Primary Examiner* — Tri M Hoang
(74) *Attorney, Agent, or Firm* — Fletcher Yoder, P.C.

(57) ABSTRACT

The systems and methods described herein involve a device that may receive a plurality of commands and generate a common command indicative of matching data signals between each of the plurality of commands. The device may include a first latch that receives a shifted flag and outputs a shifted command in response to a first enable signal. The device may include shifters, where a first shifter may receive the common command, and a last shifter may couple to the first latch. The last shifter may receive a shifter common command and may generate the first enable signal using the shifted common command.

20 Claims, 8 Drawing Sheets

SHARED COMMAND SHIFTER SYSTEMS AND METHODS

BACKGROUND

The present disclosure generally relates to memory devices and, more particularly, to systems and methods that consolidate different memory commands into a common command for more efficient command shifting.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Generally, a computing system may include an electronic device that, in operation, communicates information via electrical signals. For example, a computing system may include a processor communicatively coupled to a memory device, such as a dynamic random-access memory (DRAM) device disposed on a dual inline memory module (DIMM). In this manner, the processor may communicate with the memory device, such as to retrieve executable instructions, retrieve data to be processed by the processor, and/or store data output from the processor.

Data may be exchanged between the memory device and the processor responsive to a memory command, such as a read command, write command, or the like. The memory command may be transmitted through a command shifter. A respective command may be transmitted through a respective command shifter. However, as devices increase in complexity, an amount of space (e.g., footprint) dedicated to the command shifters may increase, which may increase an overall size of the computing subsystem and/or the memory device.

BRIEF DESCRIPTION OF THE DRAWINGS

Various aspects of this disclosure may better be understood upon reading the following detailed description and upon reference to the drawings in which.

DETAILED DESCRIPTION

Figure 1:
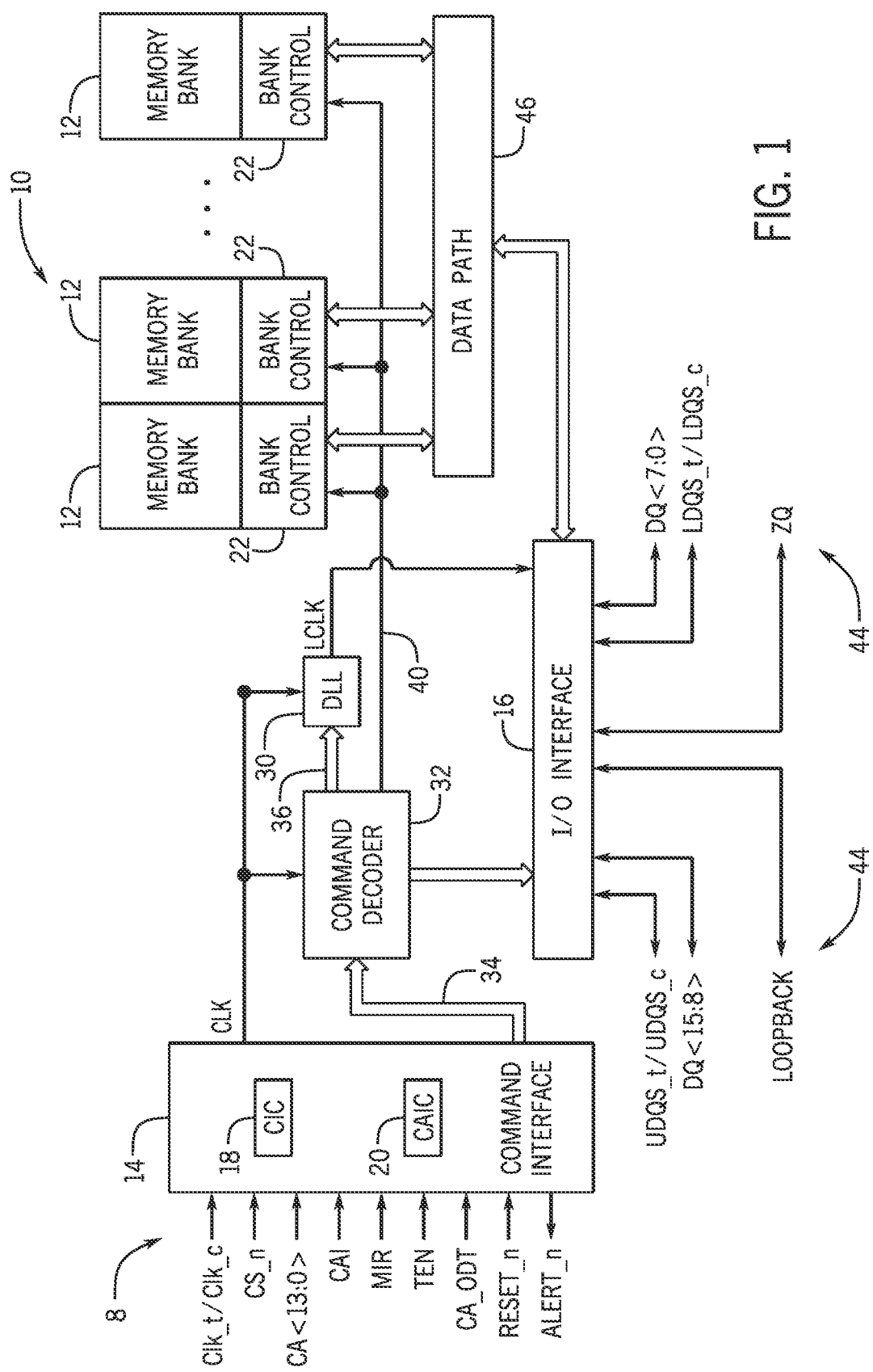
FIG. 1 is a block diagram of a memory device, in accordance with an embodiment.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions are made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

Generally, a computing system may include electronic devices that, in operation, communicate information via electrical signals. For example, electronic devices in a computing system may include a processor communicatively coupled to memory. In this manner, the processor may communicate with memory to retrieve executable instructions, retrieve data to be processed by the processor, store data output from the processor, or any combination thereof, responsive to memory commands to read or write data.

Memory commands transmitted within the computing system may be transmitted through one or more command shifters. Typically, memory commands may be transmitted one-by-one through a command shifter. As system complexities increase, larger and larger footprints of computing systems may be dedicated to command shifters and more and more processing time devoted to shifting operations. For purposes of discussion, commands discussed may be casted as memory commands. It should be understood, however, that any suitable group of commands that are transmitted within or between computing systems and have portions of the command in common (e.g., matching data bits) may be transmitted utilizing the systems and methods described herein.

Sometimes a group of memory commands may be subject to a same amount of shifting. However, operational demands and sizes of the computing device may improve (e.g., reduce) when the group of memory commands are processed together. Thus, instead of passing the separate commands through individual shifters, a single command shifter may be used to process a "common command." One or more flags may be set with the incoming common command that include information to decode the respective commands being shifted. The flags may be decoded as the command shifting occurs. Thus, by the time the shifted common command arrives at an exit point from the command shifter, the decoded type is ready and able to be used to split off the common command into one of multiple transmission or processing paths.

By processing the group of memory commands using a same shifter, circuitry footprints dedicated to command shifters and processing time dedicated to shifting operations may be reduced. For example, by combining the shifting operations, a footprint used to process four memory commands and two memory addresses may be reduced to ⅙ of its original footprint, which realizes a 6:1 area savings. Furthermore, it may be less complex to manage timing constraints for a single command shifter relative to multiple command shifters.

Processing of the common command may also reduce a number of flags associated with the incoming commands to be processed, which may reduce a time spent decoding. For example, a command may be transmitted with address flags to identify a target memory location and may be transmitted with type flags to identify whether it is a read or write command and to identify what type of read or write command. However, when processing a common command, some of the flags may be processed at a time offset from the shifting of the common command. Thus, the common command decode operation may become faster because the command shifter may begin shifting the common command before all of the flags arrive for each command.

Additional benefits may arise from using the common command shifting operations. For example, when a memory controller receives a command, the transmission of the command may introduce a delay. The delay may be an offset in timing from transmission, such as transmission between a source of the command and command decoder. However, this delay may be compensated for by using walkback operations that use multiple clocks to progress sequential stages of a shifter that shifts a common command, as opposed to a same sequentially shifted clock. By using the multiple clocks with different clocking transitions to shift each stage of the shifter, the encoded shifter stage may be used to advance the command at a steadily increasing rate to compensate and negate the delay. Thus, the shifted command output from a final stage of the shifter may output in response to a clock signal that has a period less than a clock signal operating a first stage of the shifter.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous double data rate dynamic random access memory (DDR5 SDRAM) device. Various features of DDR5 SDRAM may permit reduced power consumption, more bandwidth, and more storage capacity compared to prior generations of DDR SDRAM.

The memory device 10, may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMs). Each DIMM may include a number of SDRAM memory chips (e.g., x8 or x16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabit (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory device 10 may include a command interface 14 and an input/output (I/O) interface 16 configured to exchange (e.g., receive and transmit) signals with external devices. The command interface 14 is configured to provide a number of signals (e.g., signals 8) from an external device (not depicted), such as a processor or controller. The processor or controller may provide various signals 8 to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to permit proper handling of the signals 8. The command interface 14 may receive one or more clock signals from an external device. Generally, double data rate (DDR) memory utilizes a differential pair of system clock signals, referred to as the true clock signal (Clk_t) and the complementary clock signal (Clk_c). The positive clock edge for DDR refers to the point where the rising true clock signal (Clk_t) crosses the falling complementary clock signal (Clk_c), while the negative clock edge indicates that transition of the falling true clock signal (Clk_t) and the rising of the complementary clock signal (Clk_c). Commands (e.g., read command, write command, refresh command) are typically entered on the positive edges of the clock signal and data is transmitted or received on both the positive and negative clock edges.

The clock input circuit 18 receives the true clock signal (Clk_t) and the complementary clock signal (Clk_c) and generates an internal clock signal (CLK). The internal clock signal (CLK) is supplied to an internal clock generator 30, such as a delay locked loop (DLL) circuit. The internal clock generator 30 generates a phase controlled internal locked clock signal (LCLK) based on the received internal clock signal (CLK). The phase controlled internal locked clock signal (LCLK) is supplied to the I/O interface 16, for instance, and is used as a timing signal for determining an output timing of read data.

The internal clock signal (CLK) may also be provided to various other components within the memory device 10 and may be used to generate various additional internal clock signals. For instance, the internal clock signal (CLK) may be provided to a command decoder 32. The command decoder 32 may receive command signals from the command bus 34 and may decode the command signals to provide various internal commands. For instance, the command decoder 32 may provide command signals to the internal clock generator 30 over the bus 36 to coordinate generation of the phase controlled internal locked clock signal (LCLK). The phase controlled internal locked clock signal (LCLK) may be used to clock data through the I/O interface 16, for instance.

The command decoder 32 may decode commands, such as read commands, write commands, mode-register set commands, activate commands, or the like, and provide access to a particular memory bank 12 corresponding to the command via the bus path 40. As will be appreciated, the memory device 10 may include various other decoders, such as row decoders and column decoders, to facilitate access to the memory banks 12. In one embodiment, each memory bank 12 includes a bank control block 22 which provides the necessary decoding (e.g., row decoder and column decoder), as well as other operations, such as timing control and data control, to facilitate the execution of commands to and from the memory banks 12. Collectively, the memory banks 12 and the bank control blocks 22 may be referred to as a memory array.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t and Clk_c). The command interface may include a command address input circuit 20 which is configured to receive and transmit the commands to provide access to the memory banks 12, through the command decoder 32, for instance. In addition, the command interface 14 may receive a chip select signal (CS_n). The CS_n signal causes the memory device 10 to process commands on the incoming CA<13:0> bus. Access to specific memory banks 12 within the memory device 10 is encoded on the CA<13:0> bus with the commands.

In addition, the command interface 14 may be configured to receive a number of other command signals. For instance, a command/address on-die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals (CA<13:0>) on the command/address bus, for instance, depending on the command/address routing for the particular memory device 10. A mirror (MIR) signal may also be provided to facilitate a mirror function. The MIR signal may be used to multiplex signals so that they may be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the I/O interface 16. More specifically, the data may be sent to or retrieved from the memory banks 12 over the data path 46, which includes a plurality of bi-directional data buses. Data I/O signals, generally referred to as DQ signals, are generally transmitted and received in one or more bi-directional data busses. For certain memory devices, such as a DDR5 SDRAM memory device, the I/O signals may be divided into upper and lower bytes. For instance, for a x16 memory device, the I/O signals may be divided into upper and lower I/O signals (e.g., DQ<15:8> and DQ<7:0>) corresponding to upper and lower bytes of the data signals, for instance.

To permit higher data rates within the memory device 10, certain memory devices, such as DDR memory devices may utilize data strobe signals, generally referred to as data strobe (DQS) signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t and Clk_c), the DQS signals may be provided as a differential pair of data strobe signals (DQS_t and DQS_c) to provide differential pair signaling during reads and writes. For certain memory devices, such as a DDR5 SDRAM memory device, the differential pairs of DQS signals may be divided into upper and lower data strobe signals (e.g., UDQS_t and UDQS_c; LDQS_t and LDQS_c) corresponding to upper and lower bytes of data sent to and from the memory device 10, for instance.

An impedance (ZQ) calibration signal may also be provided to the memory device 10 through the I/O interface 16. The ZQ calibration signal may be provided to a reference pin and used to tune output drivers and on-die termination (ODT) values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and ground (GND) or low supply voltage (VSS) (GND/VSS) external to the memory device 10. This resistor acts as a reference for adjusting internal on die termination (ODT) and drive strength of I/O pins.

In addition, a loopback signal (LOOPBACK) may be provided to the memory device 10 through the I/O interface 16. The loopback signal may be used during a test or debugging phase to set the memory device 10 into a mode where signals are looped back through the memory device 10 through the same pin. For instance, the loopback signal may be used to set the memory device 10 to test the data output of the memory device 10. Loopback may include both a data and a strobe, or possibly a data pin to provide the data and/or the strobe. This is generally intended to be used to monitor the data captured by the memory device 10 at the I/O interface 16.

Various other components such as power supply circuits (for receiving external high power supply (VDD) and VSS signals), mode registers (to define various modes of programmable operations and configurations), read/write amplifiers (to amplify signals during read/write operations), temperature sensors (for sensing temperatures of the memory device 10), or the like, may also be incorporated into the memory device 10. Accordingly, it should be understood that the block diagram of FIG. 1 is only provided to highlight certain functional features of the memory device 10 to aid in the subsequent detailed description.

In some embodiments, the memory device 10 may be disposed in (physically integrated into or otherwise connected to) a host device or otherwise coupled to a host device. The host device may include any one of a computing system, desktop computer, laptop computer, pager, cellular phone, personal organizer, portable audio player, control circuit, camera, or the like. The host device may also be a network node, such as a router, server, or client (e.g., one of the previously-described types of computers). The host device may be some other sort of electronic device, such as a(n) copier, scanner, printer, game console, television, set-top video distribution or recording system, cable box, personal digital media player, factory automation system, automotive computer system, medical device, or the like. The terms used to describe these various examples of systems, like many of the other terms used herein, may share some referents and, as such, should not be construed narrowly in virtue of the other items listed.

Thus, the host device may generally be a processor-based device, which may include a processor, such as a microprocessor, that controls the processing of system functions and requests in the host device. Further, any host processor may include multiple processors that share system control. The host processor may be coupled directly or indirectly to additional system elements of the host device, such that the host processor controls the operation of the host device by executing instructions that may be stored within the host device or external to the host device.

As discussed above, data may be written to and read from the memory device 10, such as by the host device, whereby the memory device 10 operates as volatile memory, such as Double Data Rate DRAM (e.g., DDR5 SDRAM). The host device may, in some embodiments, also include separate non-volatile memory, such as read-only memory (ROM), random access memory (RAM), personal computer RAM (PC-RAM), silicon-oxide-nitride-oxide-silicon (SONOS) memory, metal-oxide-nitride-oxide-silicon (MONOS) memory, polysilicon floating gate based memory, and/or other types of flash memory of various architectures (e.g., not-AND (NAND) memory, not-OR (NOR) memory, etc.) as well as other types of memory devices (e.g., storage), such as solid state drives (SSDs), MultimediaMediaCards (MMCs), SecureDigital (SD) cards, CompactFlash (CF) cards, or any other suitable device. Further, it should be appreciated that the host device may include one or more external interfaces, such as Universal Serial Bus (USB), Peripheral Component Interconnect (PCI), PCI Express (PCI-E), Small Computer System Interface (SCSI), Institute of Electrical and Electronics Engineers (IEEE) 1394 (Firewire), or any other suitable interface as well as one or more input devices to permit a user to input data into the host device, such as by using buttons, switching elements, a keyboard, a light pen, a stylus, a mouse, and/or a voice recognition system. The host device may optionally also include an output device, such as a display coupled to the processor and a network interface device, such as a Network Interface Card (NIC), for interfacing with a network, such as the Internet. As will be appreciated, the host device may include many other components, depending on the application of the host device.

The host device may operate to transfer data to the memory device 10 for storage and may read data from the memory device 10 to perform various operations at the host device. Accordingly, to facilitate these data transmissions, in some embodiments, the I/O interface 16 may include a data transceiver that operates to receive and transmit DQ signals to and from the I/O interface 16.

Figure 2:
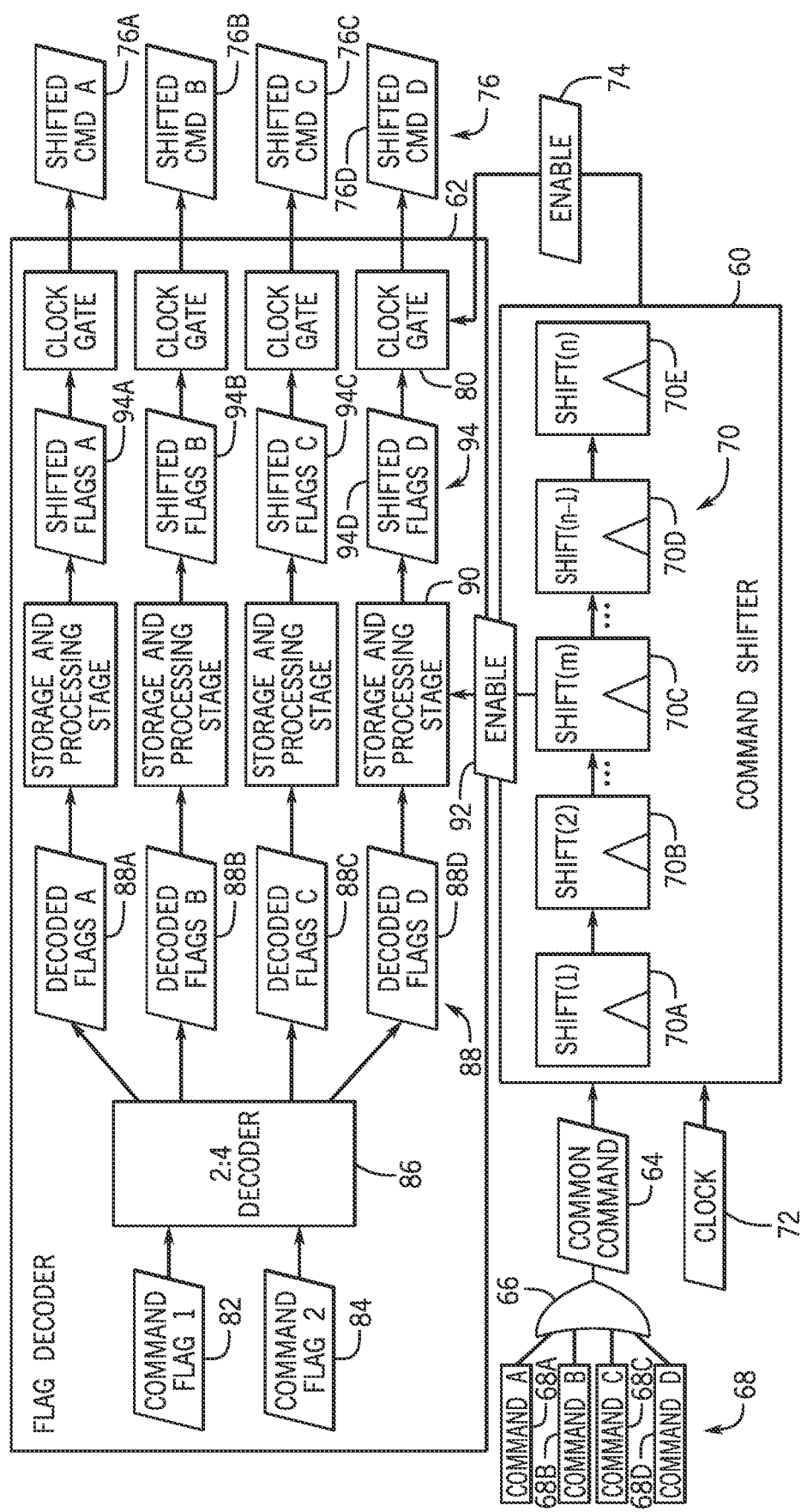
FIG. 2 is a block diagram of a portion of the memory device of FIG. 1 that includes a command shifter and a flag decoder, in accordance with an embodiment.

Keeping the foregoing in mind, FIG. 2 is a block diagram of shifting circuitry of the memory device 10 that includes a command shifter 60, such as within the command decoder 32, between the command decoder 32 and the command interface 14, or other suitable circuitry. The shifting circuitry may receive memory commands being transmitted to control circuitry, such as memory bank control circuitry 22, to instruct a memory operation to be performed, such as a refresh operation, a read operation, a write operation, or the like. For ease of discussion, the command shifter 60 is described as included within the command decoder 32. The command shifter 60 may be coupled to a flag decoder 62, which processes flags at least partially overlapping in time to the shifting of a common command 64.

The command shifter 60 may receive a common command 64 at a logic gate 66 input stage. The common command 64 may be a logical result output from logic gate 66 (e.g., OR gate). The logic gate 66 may receive commands 68 (e.g., command A 68A, command B 68B, command C 68C, and command D 68D), and output the common command 64 responsive to active voltage levels. An edge (e.g., rising edge, falling edge) of the respective commands 68 may be separated in time relative to each other according to a time duration, such as 8 clock cycles between rising edge of the command A 68A and rising edge of the command B 68B. The logic gate 66 output may toggle over time responsive to inputted command signals 68. This may result in the common command 64 having multiple pulses in response to the commands 68 being transmitted via the logic gate 66 over time.

The command shifter 60 may include shifters 70 (shifter 70A, shifter 70B, shifter 70C, shifter 70D, shifter 70E). The shifters 70 may be serially coupled latching circuitry and may include any number of shifting circuitry, n. Each shifter 70 may latch an input signal responsive to an edge of a clock signal 72 (e.g., rising edge, falling edge). The shifters 70 may be D flip-flops, set-reset (SR) flip-flops, in/out latches, AND logic gates, OR logic gates, NOR logic gates, NAND logic gates, inverters, or any suitable combinational logic circuitry that generate signals or hold a state for transmission responsive to a clocking transition, such as the rising edge of the clock signal 72. A shifter 70A may receive a common command 64 and transmit the common command 64 responsive to changes in the clock signal 72. After sequential transmission via each of the shifters 70, the common command 64 may be transmitted to the flag decoder 62 as an enable signal 74. The enable signal 74 may cause transmission of shifted commands 76 (shifted command A 76A, shifted command B 76B, shifted command C 76C, shifted command D 76D).

The flag decoder 62 may receive a first command flag 82 and a second command flag 84 at a decoder 86. The first command flag 82 may correspond to a read (RD) flag. The second command flag 84 may correspond to a non-target (NT) flag. Together, the first command flag 82 and the second command flag 84 may define a type of memory command as a read command (e.g., RD=1, NT=0), a read non-target command (e.g., RD=1, NT=1), a write command (e.g., RD=0, NT=0), or a write non-target command (e.g., RD=0, NT=1).

The decoder 86 may be a 2:4 decoder that generates four signals from two signals, though any suitably sized decoder may be used. The decoder 86 may generate four decoded command flags 88 (decoded command flags 88A, decoded command flags 88B, decoded command flags 88C, decoded command flags 88D) using the first command flag 82 and the second command flag 84. The first command flag 82 and the second command flag 84 may be written to the decoder 86 and over time may represent values associated with the commands 68. The flag decoder 62 may decode values of the signals transmitted as the first command flag 82 and the second command flag 84 to generate an indication of a specific command type for processing before being output from the flag decoder 62 with the shifted commands 76.

An intermediate storage stage, storage and processing stage 90, may be used to create a suitable hold margin for the decoded command flags 88 before reaching the exit stage (e.g., clock gates 80). The first command flag 82 and the second command flag 84 may be received and/or processed at a relatively faster rate than the common command 64 is shifted. The storage and processing stage 90 may latch the values of the decoded command flags 88 until receiving an enable signal 92 that triggers output of shifted flags 94 (shifted flags A 94A, shifted flags B 94B, shifted flags C 94C, shifted flags D 94D) respectively from the clock gates 80 over time.

Thus, the storage and processing stage 90 may ensure there is a 1:1 correspondence between the shifted flags 78 being output and shifted common command output from the command shifter 60 as the enable signal 74. The hold margin of the storage and processing stage 90 may be such to cause a reception of the shifted flags 94 at the exit stage (e.g., respective clock gates 80) to occur before the edge of the enable signal 92. The enable signal 92 may cause the shifted flags 94 to transmit from the clock gates 80 as or with the shifted commands 76. For example, a respective clock gate 80 may transmit a signal as respective shifted commands 76 after aligning the signal to an edge of the enable signal 74 and may append respective shifted flags 94 to the start or end of the shifted commands 76. The clock gates 80 receive the different shifted flags 94 at different times relative to each other such that different edges of the enable signal 74 clocks out different respective shifted commands 76. Timing of respective shifted commands 76 output from the flag decoder 62 may align to a start time corresponding to when the enable signal 74 is received at the clock gate 80.

To elaborate, FIG. 3-6 are timing diagrams that illustrate simulated signals used to test transmission through the command shifter 60 and/or the flag decoder 62. The timing diagrams illustrate digital logic signals that change between logic low voltage levels (e.g., "0") and logic high voltage levels (e.g., "1"). It should be understood that any suitable voltage level may be used as the logic high voltage level and/or as the logic low voltage level. Labels for the timing diagrams correspond to labels of FIG. 2, and thus FIGS. 2-6 are referred to together, herein.

Figure 3:
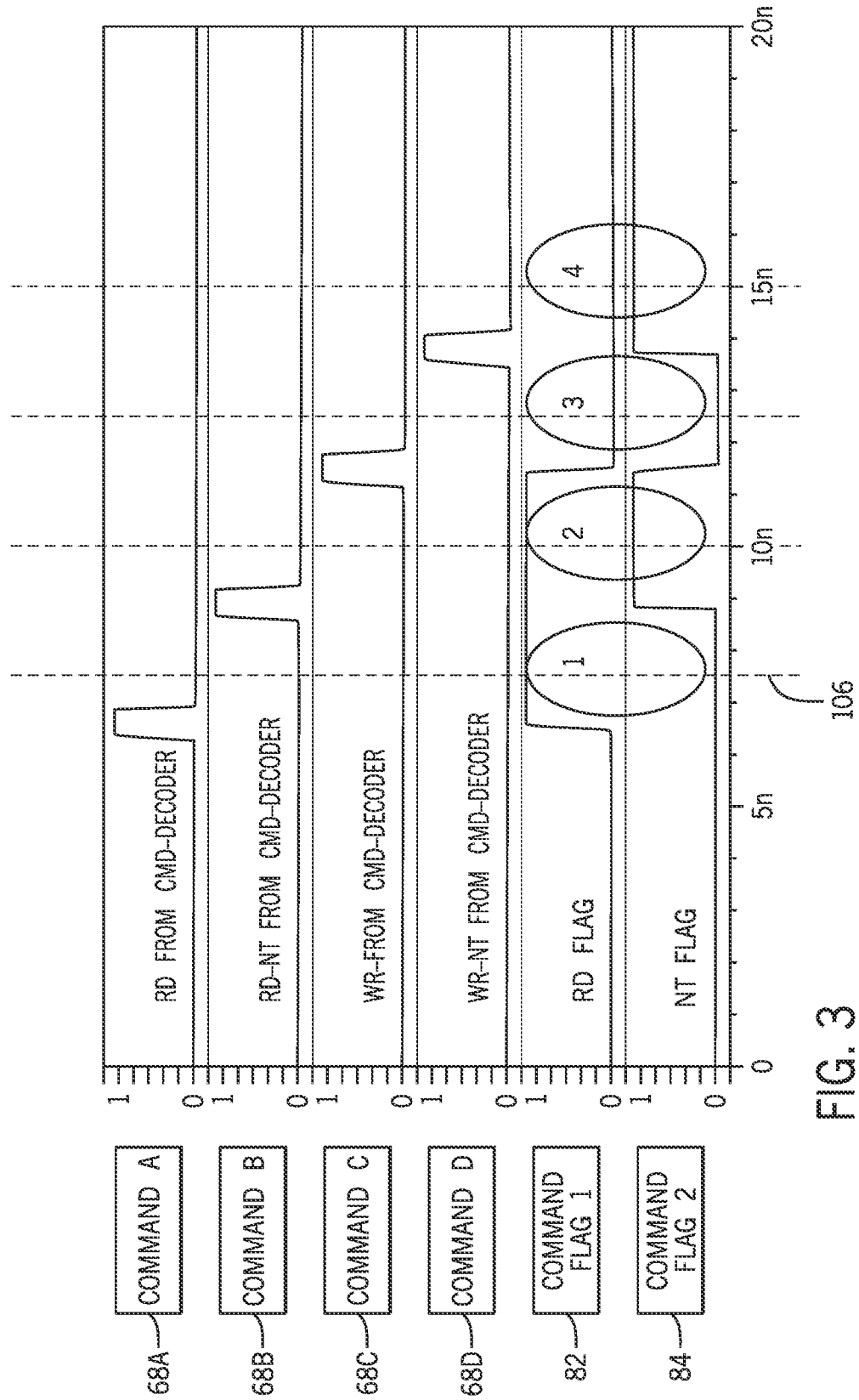
FIG. 3 is a timing diagram of signals input to the command shifter and/or the flag decoder of FIG. 2, in accordance with an embodiment.

FIG. 3 is a timing diagram of the commands 68, the first command flag 82, and the second command flag 84. The logic gate 66 of FIG. 2 may receive the commands 68, which initiate the shifting operations of the command shifter 60. The flag decoder 62 may receive the first command flags 82 and the second command flags 84 in association with the command shifter 60 receiving the commands 68. The respective commands 68 align generally in time with the transmission of its corresponding values of the first command flag 82 and second command flag 84.

To elaborate, a pulse of the command A 68A aligns generally with a rising edge of the first command flag 82. Flags for the command A 68A may be sampled at time 106 (e.g., duration of time generally corresponding to the "1"), such as approximately 7.5 nanoseconds (ns). When sampled, the flags for the command A 68A correspond to a RD=1 and NT=0 combination. As noted above, this combination of flags may indicate a read command. Thus, the command A 68A may instruct a read command. At the time 106, the command A 68A may be inactive and the pulse may be done transmitting. The flag decoder 62 may align the value of sampled flags with the timing of the command A 68A pulse in response to the enable signal 92 and the enable signal 74 to recreate the command A 68A pulse from the shifting of the common command 64.

A similar sampling may occur again at approximately 10 ns (e.g., "2"), 12.5 ns (e.g., "3"), and 15 ns (e.g., "4"). The sampling may result in flags for the command B 68B corresponding to a RD=1 and NT=1 combination, flags for the command C 68C corresponding to a RD=0 and NT=0 combination, and flags for the command D 68D corresponding to a RD=0 and NT=1 combination. Thus, the command B 68B may instruct a read non-target command, the command C 68C may instruct a write command, and the command D 68D may instruct a write non-target command.

Figure 4:
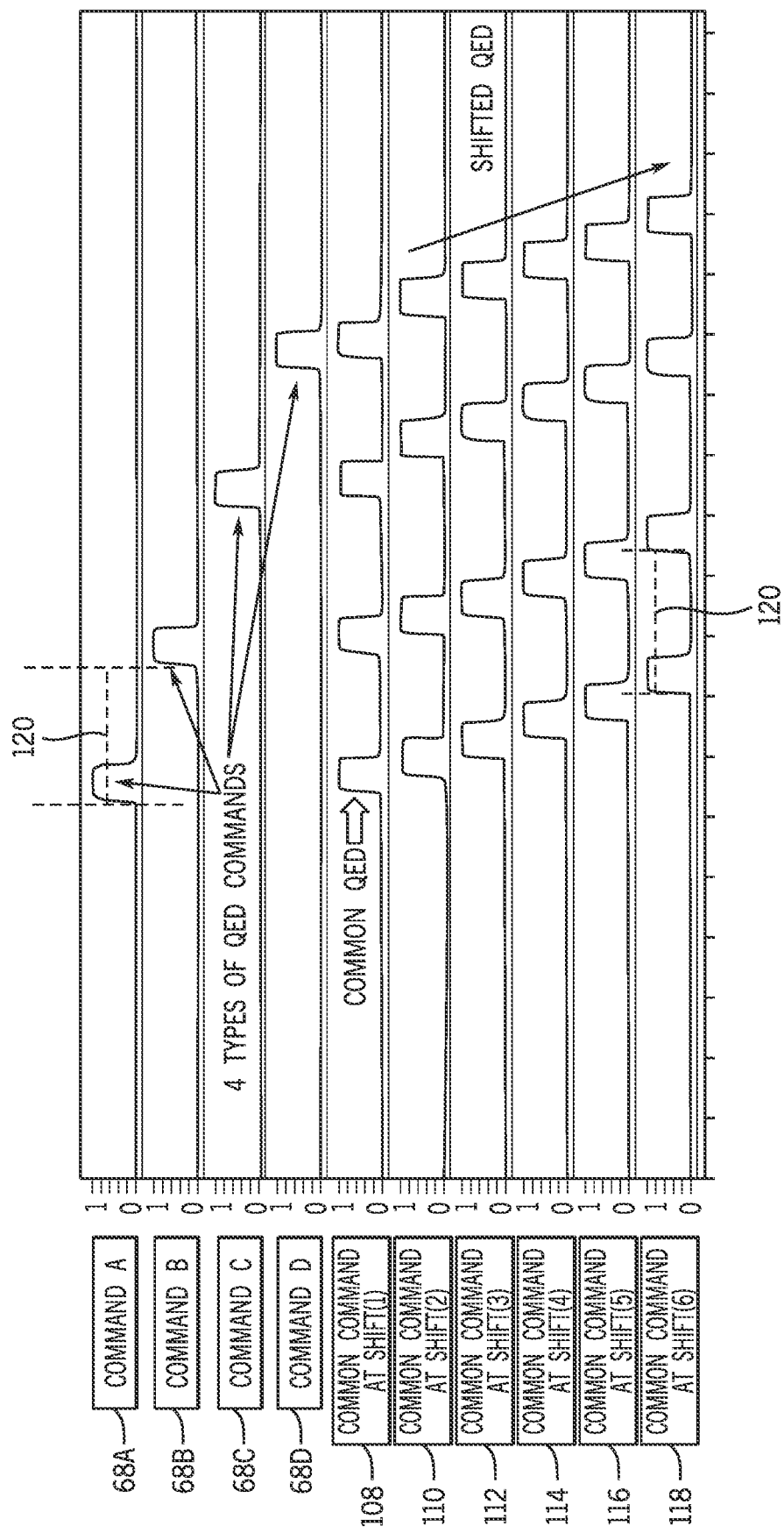
FIG. 4 is a timing diagram of some of the signals of FIG. 3 used to generate a common command and signals resulting from shifting the common command via the command shifter of FIG. 2, in accordance with an embodiment.

FIG. 4 is a timing diagram of the commands 68 and the common command 64 sampled after different shifters 70 throughout the shifting. The commands 68 may be what the logic gate 66 receives in FIG. 2 to initiate the shifting operations. Common command at shift(1) (e.g., signal 108) may correspond to a sampling result when sampling the common command 64 after transmission through a first shifter of the shifters 70 (e.g., Shift(1)). It is noted that the example of FIG. 2 may have any number of shifters 70 but that for purposes of description, the FIGS. 3-6 describe 6 shifters, referred to as first shifter (shift(1)), second shifter (shift(2)), third shifter (shift(3)), fourth shifter (shift(4)), fifth shifter (shift(5)), and sixth shifter (shift(6)). Similar to FIG. 2, the logic gate 66 may couple to an input of the first shifter, the fourth shifter may couple to the storage and processing stages 90 to transmit the enable signal 92, and the sixth shifter may couple to the clock gates 80 to transmit the enable signal 74. Similarly, common command at shift(2) (e.g., signal 110) may correspond to a sampling result when sampling the common command 64 after transmission through a second shifter of the shifters 70 (e.g., Shift(2)). Likewise, common command at shift(3) (e.g., signal 112) may correspond to an output from the third shifter, common command at shift(4) (e.g., signal 114) correspond to an output from the fourth shifter, common command at shift(5) (e.g., signal 116) may correspond to an output from the fifth shifter, and common command at shift(6) (e.g., signal 118) may correspond to an output from the sixth shifter. As may be appreciated from the timing diagram, over time, the common command 64 is incrementally shifted through each of the shifters 70. As the common command 64 is shifted via the command shifter 60, each of the respective timing durations between the pulses corresponding to each of the commands 68 remains unchanged when compared to the timing durations between the originally received pulses of the commands 68. For example, the time period between a rising edge of command A 68A and a rising edge of command B 68B may be substantially maintained at time duration 120 throughout the transmission via the command shifter 60.

Figure 5:
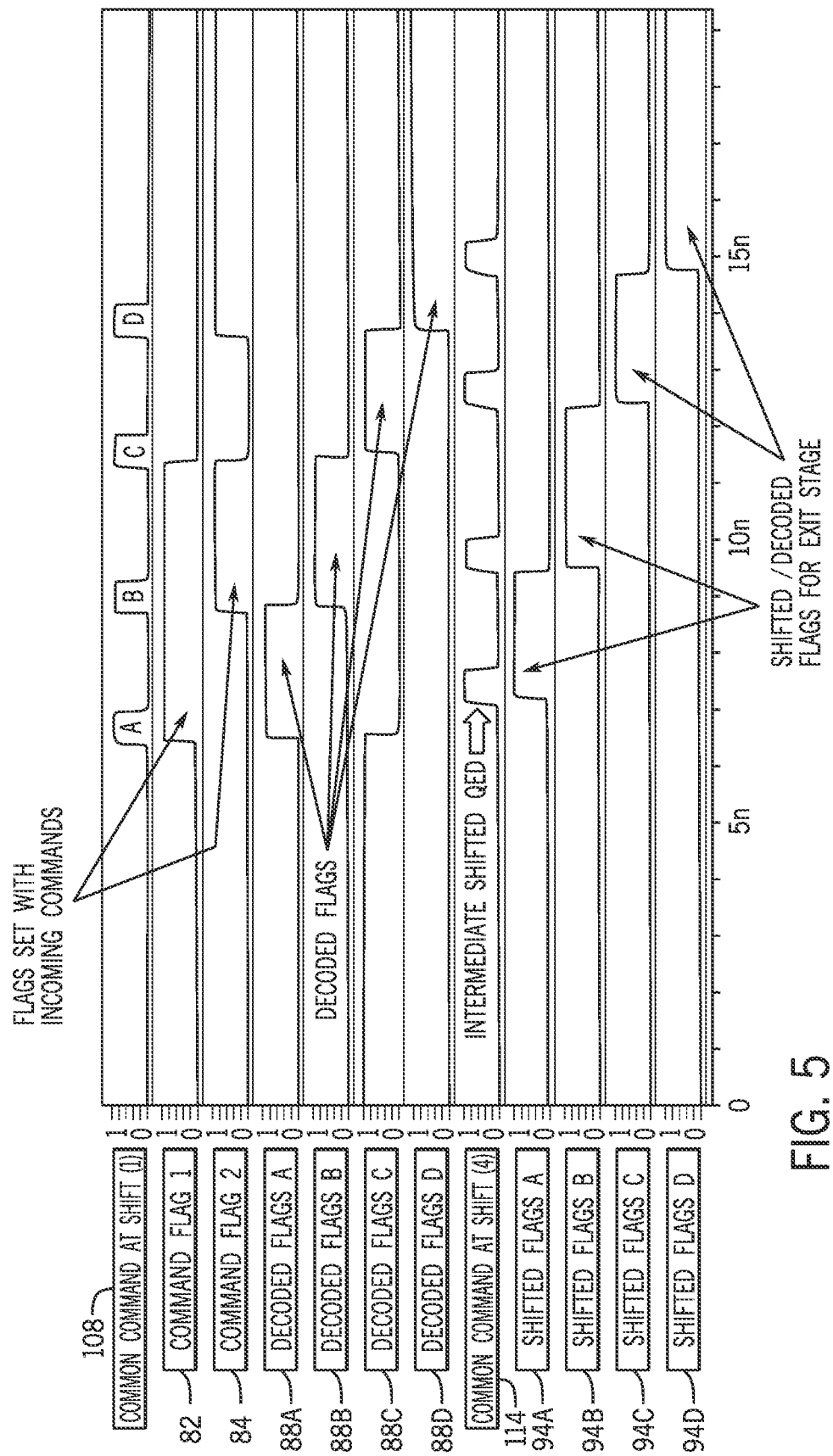
FIG. 5 is a timing diagram of the common command of FIG. 4 compared to input command flags of FIG. 3 and subsequently shifted input flags resulting from shifting the input flags via the flag decoder of FIG. 2, in accordance with an embodiment.

To elaborate further on the processing relationship between the flags and the common command 64, FIG. 5 is a timing diagram that includes the common command at shift(1) (e.g., signal 108) (e.g., generally indicative of the common command 64 before shifting occurs) compared to timing of the flags through the various stages of flag decoding and shifting performed by the flag decoder 62. The first command flag 82 and the second command flag 84 are shown in the timing diagram as would be received by the decoder 86. The decoder 86 decoding the first command flag 82 and the second command flag 84 into respective command flags may generate the decoded command flags 88. It is noted that the respective rising edges of the decoded command flags 88 align with the respective rising edges of the respective command pulses (e.g., pulse "A," pulse "B," pulse "C," pulse "D") of the common command at shift(1) (e.g., signal 108). The decoded flags 88 may be received at the storage and processing stages 90 at staggered times, as may be appreciated from the relative timing of the timing diagram signals.

To latch the decoded command flags 88, the common command 64 may be latched after four cycles through the command shifter 60 as the common command at shift(4) (e.g., signal 114) and transmitted to the storage and processing stages 90 as the enable signal 92. Since the timing of the pulses of the common command at shift(4) (e.g., signal 114) aligns with rising edges of the decoded command flags 88, the storage and processing stages 90 may capture the corresponding of the decoded command flags 88 responsive to the corresponding pulse, despite the same enable signal 92 being transmitted to each storage and processing stage 90. For example, decoded flag A 88A latches at pulse "A," decoded flag B 88B latches at pulse "B," and so on. In response to receiving pulses of the common command at shift(4) (e.g., signal 114) as the enable signal 92, the respective storage and processing stages 90 may respectively output the shifted flags 94.

Figure 6:
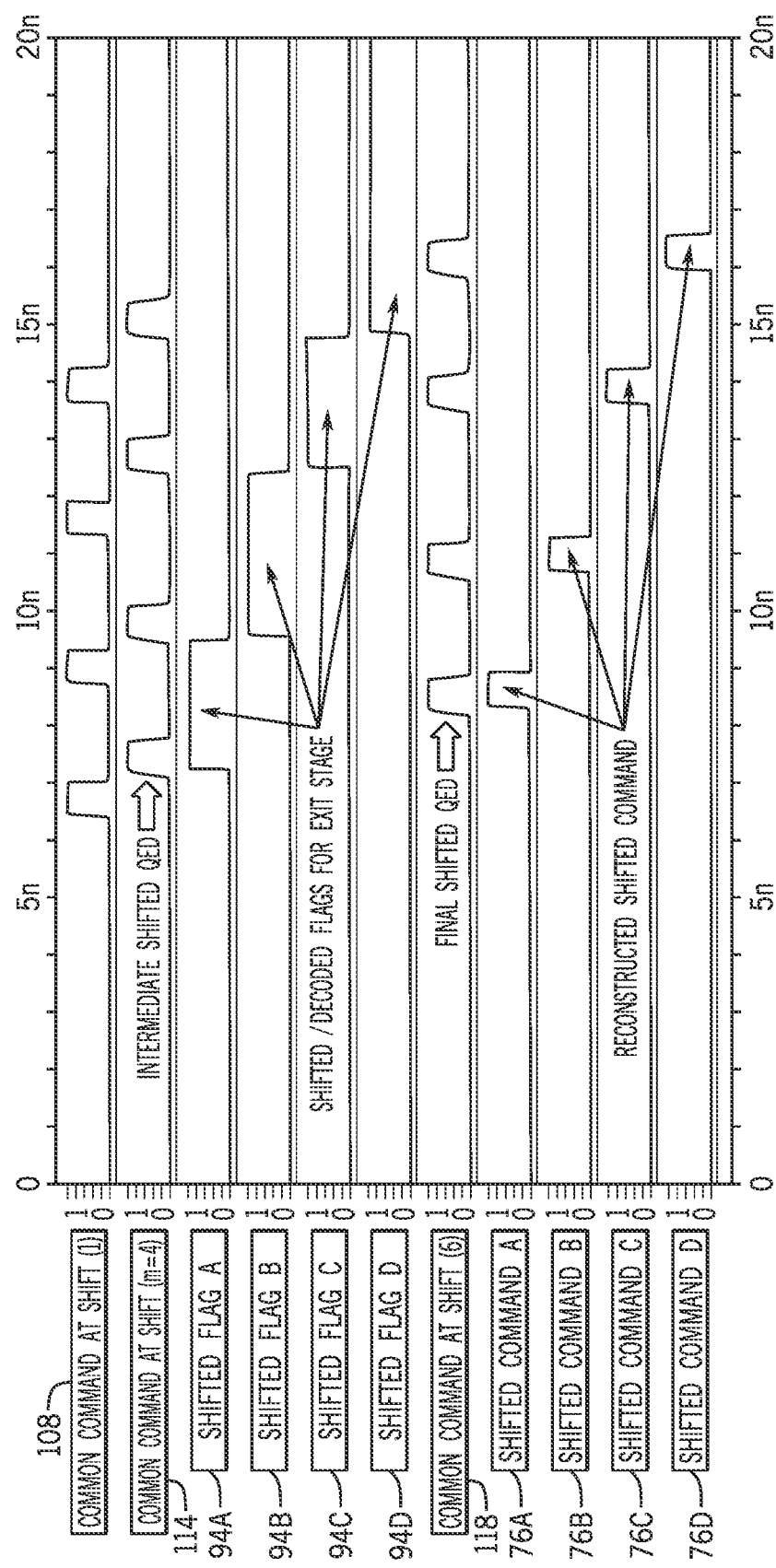
FIG. 6 is a timing diagram of the common command of FIG. 4 and the shifted input flags of FIG. 5 compared to resulting shifted commands transmitted from the flag decoder, in accordance with an embodiment.

The clock gates 80 may respectively receive the shifted flags 94 and await transmission of active pulses of the common command at shift(6) (e.g., signal 118) transmitted as enable signal 74, as elaborated in FIG. 6. FIG. 6 is a timing diagram that illustrates the common command 64 after different shifters 70, the shifted flags 94, and the shifted commands 76. Each clock gate 80 may receive a corresponding one of the shifted flags 94 over time and await a respective enable signal 74 pulse before transmitting each respective of the shifted flags 94 with the reconstructed shifted commands 76. The clock gates 80 may transmit the shifted commands 76 in response to the corresponding pulse of the common command 64 output from the sixth shifter (e.g., common command at shift(6), signal 118).

Figure 7:
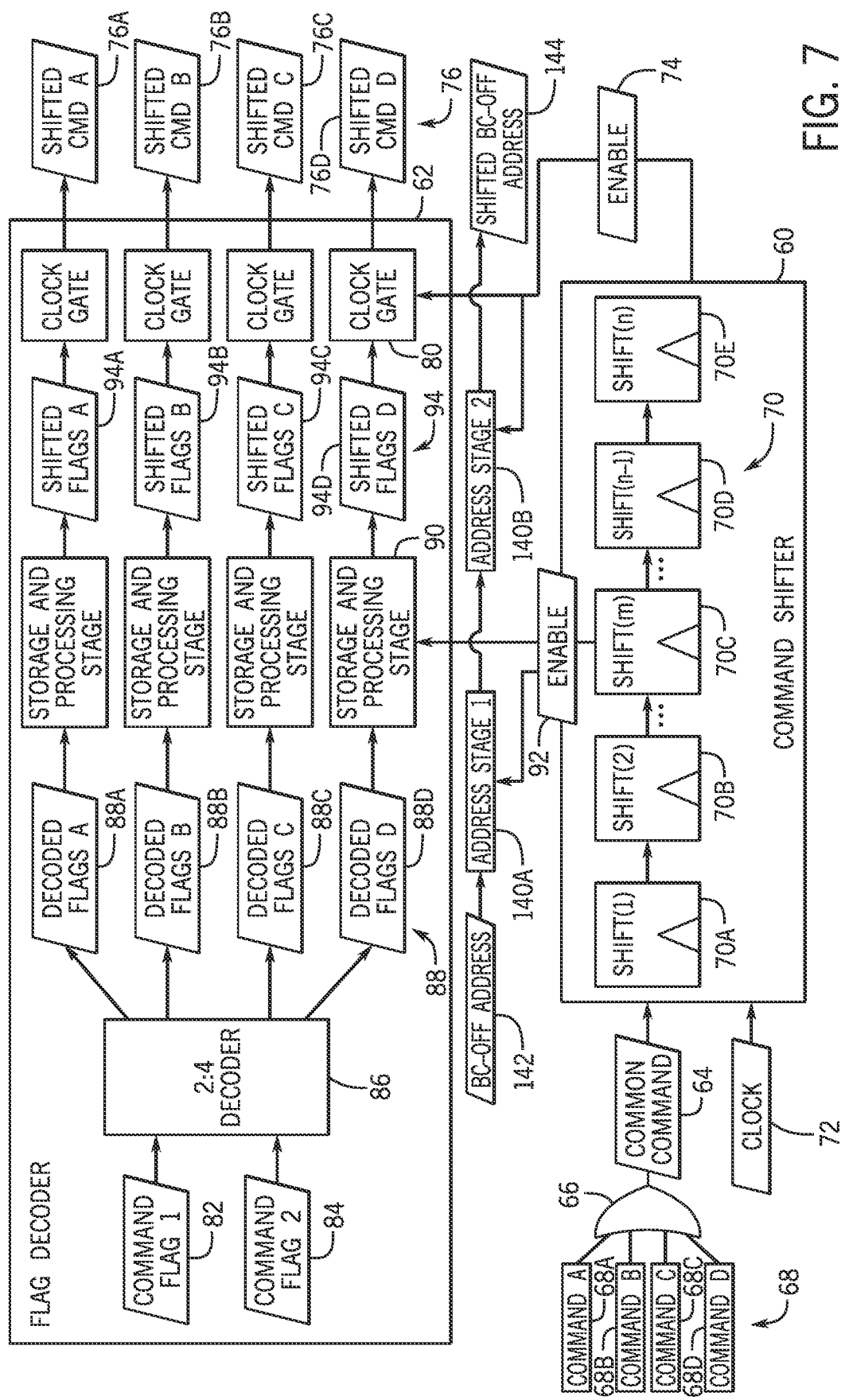
FIG. 7 is a block diagram of the command shifter and the flag decoder of FIG. 2 that includes an address shifter stage, in accordance with an embodiment.

Many types of signals may be transmitted via the command shifter 60. For example, any address associated with the group of commands 68 transmitted through the command shifter 60 may be treated similarly to the first command flag 82 and the second command flag 84. FIG. 7 is a block diagram of the command shifter 60, the flag decoder 62, and address stages 140 (address stage 140A, address stage 140B). The address stage 140A may receive a bust chop on-the-fly (BC-OTF) address 142 (e.g., burst chop address) during a partially overlapping time period to the first command flag 82, the second command flag 84, and the commands 68. Like the first command flag 82 and the second command flag 84, the BC-OTF address 142 may change with each the commands 68 (e.g., at time of respective pulse "A," "B," "C," "D" of FIG. 5). The address stage 140A may transmit the value of the BC-OTF address 142 to the address stage 140B in response to the enable signal 92. The address stage 140B may wait to transmit the value of the BC-OTF address 142 until receiving the enable signal 92. The address stage 140B may transmit the value of the BC-OTF address 142 as a shifted BC-OTF address 144 in response to the enable signal 74. This may align timing of the respective shifted flags 94 and the shifted commands 76 with the respectively output shifted BC-OTF addresses 144.

In some embodiments, some commands may have a portion of matching data rather than a wholly matching signal. Hybrid shifting operations may be used to use the portion of matching data as a common command. The hybrid shifting operations may use a sampling block to isolate the matching data from the group of commands. The unmatched data may be transmitted similar to the flags or as the flags via the flag decoder 62. This may be further beneficial when the group of commands to be transmitted via a common command includes one or more commands that are not normally associated with command flags, like a mode register write (MRW).

Figure 8:
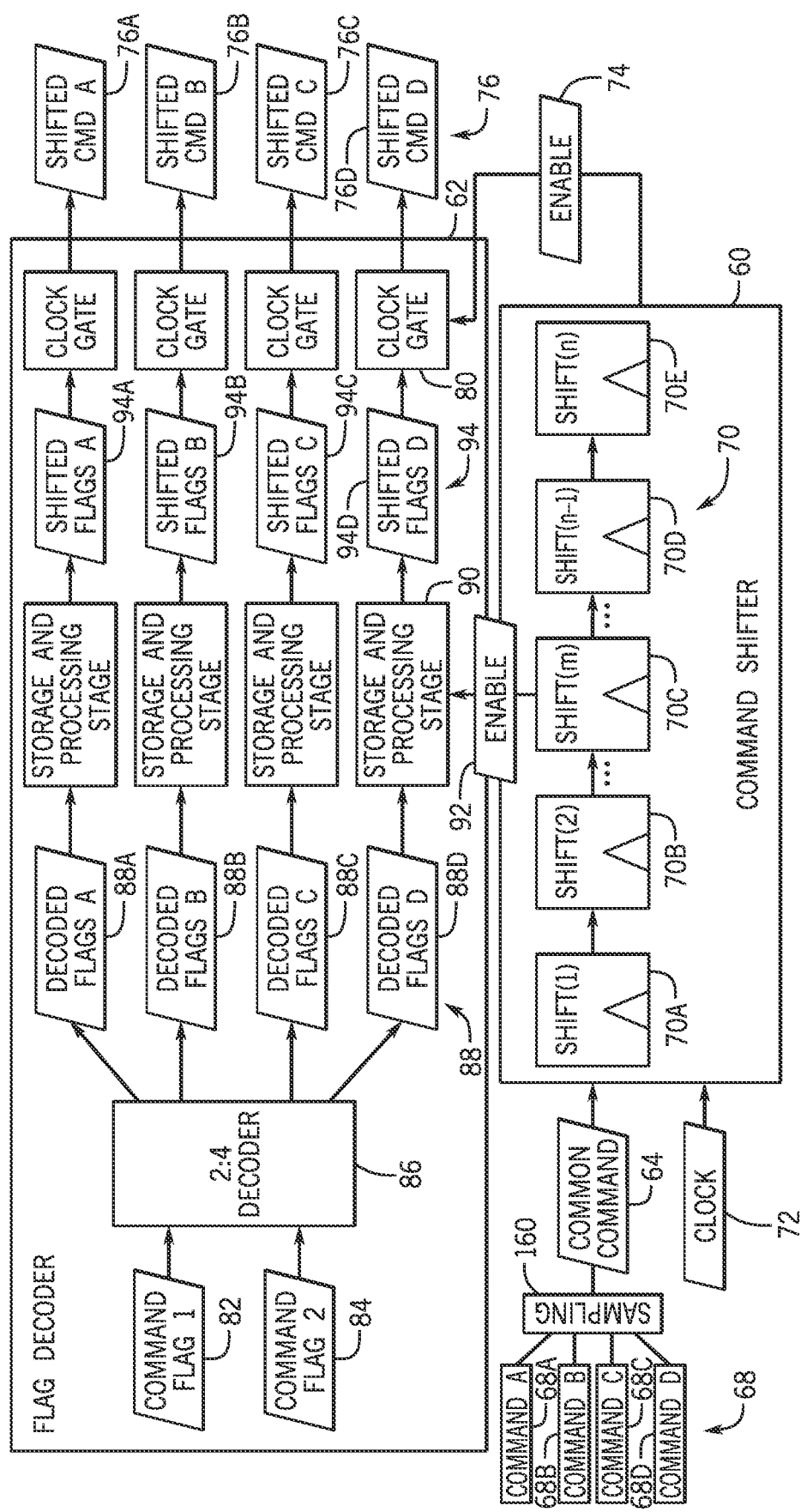
FIG. 8 is a block diagram of the command shifter and the flag decoder of FIG. 2 that includes a sampling stage, in accordance with an embodiment.

FIG. 8 is a block diagram of the command shifter 60 and the flag decoder 62 implementing the hybrid shifting operations that use sampling circuitry 160 as the input stage. For example, read training and write leveling commands may use a mode register write (MRW) command not associated with signals to be decoded via the flag decoder 62. Thus, even though a MRW command may be shifted through the command shifter 60 with the other commands 68, no command would output from the clock gates 80 for the MRW command since there would be no active shifted flag of the shifted flags 94 to correspond to the MRW command. To resolve this, portions of the commands 68 signals that are similar between the commands 68 may be used in place of the whole command as the common command 64. The sampling circuitry 160 may generate the common command 64 by identifying matching data signals between each of the commands 68. This identification may involve identifying which address bits or other data signals are shared by (e.g., common to) each of the commands 68. In some cases, the sampling circuitry 160 may also identify which data of the commands 68 is not matching, and may transmit unmatched or uncommon data between the commands 68 via the flag decoder 62, similar to the command flags 82, 84, to be used as shifted flags 94 when capturing the shifted commands 76. Thus, in some cases, the commands 68 transmitted to the command shifter 60 may bypass a logic gate 66 (or the logic gate 66 be totally excluded as is illustrated) and sampling circuitry 160 may sample a subset of data bits transmitted as the commands 68. The sampling circuitry 160 may transmit any number of common bits between the commands 160 as the common command 64, such as two bits, three bits, or more. Indeed, this example highlights the flexibility of including a shared command shifter 60 in an electronic device and its ability to consolidate transmission of signals with similar segments or clocking patterns for a subset of an overall transmission path. Table 1 may elaborate on example command signals and provide a visualization of the common bits between various commands 68.

TABLE 1

| Function (Command Type) | Address Bit 0 | Address Bit 1 | Address Bit 2 | Address Bit 3 | Address Bit 4 |
|---|---|---|---|---|---|
| Mode register write (MRW) | 1 | 0 | 1 | 0 | 0 |
| Write (WR) | 1 | 0 | 1 | 1 | 0 |
| Write NT (WR-NT) | 1 | 0 | 1 | 1 | 0 |
| Read (RD) | 1 | 0 | 1 | 1 | 1 |

In Table 1, each of the MRW, WR, WR-NT, and RD functions (e.g., commands 68) have matching logical states for address bit 0 and address bit 1. Thus, the command shifter 60 may shift the logical states for address bit 0 and address bit 1 as the common command 64 when transmitting any of the listed functions together. The address bit 2, address bit 3, and address bit 4 may be transmitted with any additional flags or address signals via the flag decoder 62, provided that the timing of the various additional information aligns with the timing of the enable signal 92 at the storage and processing stage 90 and the enable signal 74 at the clock gate 80. These systems and methods may be applied to transmission of any suitable command or communication signals that transmit logical data with the value of the signals, such as certain communication applications, data processing applications, or the like.

In FIG. 4, although the time duration 120 is described as maintained during the course of shifting, it should be noted that the time duration 120 may be intentionally changed (e.g., phase-shifted) to compensate transmission delays in the transmitted commands 68 via command walkback. For example, timing of the clock signal 72 may be adjusted to gradually compensate for changes or delays expected to be or experienced by the various commands 68. This may improve operational efficiency by combining compensation operations with the shifting operations of the command shifter 60.

Accordingly, the present disclosure may describe systems and methods that enable more efficient command and signal shifting within electronic devices. By processing the group of memory commands using a same shifter, circuitry footprints dedicated to command shifters and processing time dedicated to shifting operations may be reduced. For example, by combining the shifting operations, a footprint used to process four memory commands and two memory addresses may be reduced to ⅙ of its original footprint, which realizes a 6:1 area savings. Furthermore, it may be less complex to manage timing constraints for a single command shifter relative to multiple command shifters. Additional benefits may arise from the encoded shifter stage described herein, such as being able to perform walkback operations simultaneous to shifting operations. Processing of the common command may also reduce a number of flags associated with the incoming commands to be processed, which may reduce a time spent decoding.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A device, comprising:
    an input stage configured to receive a plurality of commands and to generate a common command indicative of matching data signals between each of the plurality of commands;
    a first latch configured to receive a shifted flag and to output a shifted command in response to a first enable signal; and
    a command shifter comprising a plurality of shifters, wherein a first shifter of the plurality of shifters is configured to couple to the input stage to receive the common command, wherein a second shifter of the plurality of shifters is configured to couple to the first latch, and wherein the second shifter receives the common command from the first shifter and generates the first enable signal using the common command.

2. The device of claim 1, comprising:
    a third shifter disposed between the first shifter and the second shifter, wherein the third shifter is configured to generate a second enable signal in response to receiving the common command and to transmit the second enable signal to a second latch.

3. The device of claim 2, wherein the second latch is coupled to the third shifter, and wherein the second latch is configured to receive a decoded flag and to output the decoded flag in response to the second enable signal.

4. The device of claim 3, comprising a decoder configured to generate four decoded flags based at least in part on two command flags corresponding to the plurality of commands, wherein the four decoded flags comprise the decoded flag, and wherein values of each of the two command flags comprise values for each of the plurality of commands over time.

5. The device of claim 1, wherein the input stage comprises a sampling circuitry configured to identify the matching data signals between each of the plurality of commands based at least in part on identifying which address bits are shared by each of the plurality of commands.

6. The device of claim 5, wherein the sampling circuitry is configured to output the address bits as the common command.

7. The device of claim 6, wherein any remaining address bits of the plurality of commands are configured to be transmitted via a flag decoder configured to recapture the plurality of commands based on the remaining address bits in response to the common command being output from the second shifter.

8. The device of claim 1, wherein the input stage comprises an OR logic gate.

9. The device of claim 1, wherein a pair of address stages transmit a burst chop address during a partially overlapping time period with transmission of the common command.

10. The device of claim 1, wherein the plurality of commands comprises a read command, a read non-target command, a write command, a write non-target command, or any combination thereof.

11. A method of operating a memory device, comprising:
    receiving, via an input stage of a circuit, a first memory command;
    generating, via the input stage, a common command comprising a portion of the first memory command that matches a portion of a second memory command also received at the input stage;
    shifting, via a command shifter of the circuit, the common command;
    transmitting, via the command shifter, a first enable signal to a storage and processing stage of a flag decoder configured to transmit a decoded flag corresponding to the first memory command, wherein the first enable signal is generated in response to the common command being shifted through a respective shifter of the command shifter; and transmitting, via the command shifter, a second enable signal to a clock gate of the flag decoder, wherein the clock gate is configured to receive a shifted command flag from the storage and processing stage, wherein the clock gate is configured to transmit a first command in response to the second enable signal to align timing of the first command with an edge of the second enable signal, and wherein the first command is transmitted in association with the shifted command.

12. The method of claim 11, comprising generating, via the command shifter, the second enable signal as the common command.

13. The method of claim 11, comprising:
transmitting, via the command shifter, the first enable signal to a plurality of storage and processing stages of the flag decoder, wherein the plurality of storage and processing stages comprises the storage and processing stage.

14. The method of claim 13, wherein the plurality of storage and processing stages are configured to transmit respective decoded flags including the decoded flag at different times corresponding to rising edges of the common command.

15. The method of claim 14, wherein the respective decoded flags each comprise a combination of logic signals indicative of memory command types comprising a read command type, a read non-target command type, a write command type, and a write non-target command type.

16. A system, comprising:
a command decoder configured to receive instructions from processing circuitry of a host device and generate a plurality of memory commands based on the instructions;
shifting circuitry coupled to the command decoder, wherein the shifting circuitry is configured to receive the plurality of memory commands from the command decoder and transmit the plurality of memory commands after shifting the plurality of memory commands, wherein to transmit the plurality of memory commands, the shifting circuitry is configured to:
receive the plurality of memory commands;
transmit a data signal comprising signals common to each of the plurality of memory commands as a common command via a command shifter;
transmit a data signal comprising signals different between a subset of the plurality of memory commands via a flag decoder; and
capture the plurality of memory commands from an output from the command shifter and an output from the flag decoder as a plurality of shifted memory commands; and
memory bank control circuitry configured to receive the plurality of shifted memory commands.

17. The system of claim 16, wherein the shifting circuitry is configured to compensate for a transmission delay during transmission of the plurality of memory commands through the command shifter via a walkback operation.

18. The system of claim 16, wherein the data signal common to each of the plurality of memory commands is generated in response to a logic gate toggling an output based on respective active levels of each of the plurality of memory commands.

19. The system of claim 16, wherein the shifting circuitry comprises:
an input stage configured to receive the plurality of memory commands and to generate the common command;
a first latch configured to receive a shifted flag corresponding to the data signal and to output a shifted command of the plurality of shifted memory commands in response to a first enable signal; and
wherein the command shifter comprises a plurality of shifters, wherein a first shifter of the plurality of shifters is coupled to the input stage to receive the common command, wherein a last shifter of the plurality of shifters is coupled to the first latch, and wherein the last shifter receives the common command from the first shifter and generates the first enable signal using the common command.

20. The system of claim 16, wherein the memory bank control circuitry is configured to write or read data from a memory bank responsive to the plurality of shifted memory commands.

* * * * *